(12) United States Patent
Kordic et al.

(10) Patent No.: US 7,064,053 B2
(45) Date of Patent: Jun. 20, 2006

(54) PROCESS FOR FABRICATING AN ELECTRICAL CIRCUIT COMPRISING A POLISHING STEP

(75) Inventors: Srdjan Kordic, Bernin (FR); Alain Inard, St Nazaire les Eynes (FR); Céline Roussel, St Martin d'Héres (FR); Philippe Gayet, Saint Vincent de Mercuze (FR)

(73) Assignees: STMicroelectronics SA (FR); Koninklijke Philips Electronics N.V. (NL)

( * ) Notice: Subject to any disclaimer, the term of this patent is extended or adjusted under 35 U.S.C. 154(b) by 210 days.

(21) Appl. No.: 10/651,492

(22) Filed: Aug. 29, 2003

(65) Prior Publication Data

US 2004/0087140 A1   May 6, 2004

(30) Foreign Application Priority Data

Aug. 30, 2002   (FR) .................................. 02 10779

(51) Int. Cl.
*H01L 21/44* (2006.01)
*H01L 21/20* (2006.01)
*H01L 21/311* (2006.01)

(52) U.S. Cl. .................. 438/597; 438/584; 438/700
(58) Field of Classification Search ................ 438/584, 438/597, 689, 690, 691, 694, 697, 700
See application file for complete search history.

(56) References Cited

U.S. PATENT DOCUMENTS

| | | | |
|---|---|---|---|
| 6,214,745 B1 | 4/2001 | Yang et al. | |
| 6,232,231 B1 | 5/2001 | Sethuraman et al. | |
| 6,326,309 B1 | 12/2001 | Hatanaka et al. | |
| 6,585,568 B1 * | 7/2003 | Tsuchiya et al. | 451/36 |
| 6,656,842 B1 * | 12/2003 | Li et al. | 438/691 |
| 6,734,080 B1 * | 5/2004 | Yang et al. | 438/427 |
| 2002/0000663 A1 | 1/2002 | Nakayama | |
| 2002/0031879 A1 | 3/2002 | Itoh et al. | |
| 2002/0050655 A1 | 5/2002 | Travis et al. | |

* cited by examiner

Primary Examiner—Scott Geyer (57) ABSTRACT

A process for fabricating an integrated electrical circuit comprises the formation and then the removal of conducting inserts. Components of the electrical circuit are incorporated into insulating materials superposed on top of a substrate. The process makes it possible to provide an exclusion volume around certain components sensitive to electrostatic coupling, while giving each insulating material a planar surface at the end of a polishing step.

32 Claims, 8 Drawing Sheets

PROCESS FOR FABRICATING AN ELECTRICAL CIRCUIT COMPRISING A POLISHING STEP

TECHNICAL FIELD OF THE INVENTION

The present invention relates to the damascene-type process for fabricating integrated electrical circuits or to a similar process.

BACKGROUND OF THE INVENTION

According to the damascene process, electrical circuits including metallic connections are placed within a layer of electrically insulating material present on a surface of a substrate. During a first step of the process, this layer is etched at a surface of this layer opposite the substrate, so as to produce trenches corresponding to the connections intended to be formed. During a second step, the layer of insulating material is covered with a coating of metallic material, such as copper, so as to fill the trenches. A polishing step is then carried out so as to remove a surplus of metallic material on top of the layer of insulating material. The process for fabricating the electrical circuit furthermore includes many other steps known to those skilled in the art, especially steps for producing semiconductor components such as transistors or diodes.

A complete electrical circuit produced on a surface of a substrate generally comprises several superposed layers of electrically insulating material, each of them incorporating metallic parts. Each layer is formed according to the preceding damascene process, which is carried out several times so as to obtain, in succession, all the layers, for example up to eight or nine superposed layers.

The "dual damascene" process constitutes a known variant of the damascene process. In this variant, the trenches etched within the layer of insulating material are distributed at two levels in the thickness of this layer. The trenches of the two levels are filled with metallic material during a single step of depositing this metallic material. The filled trenches belonging to the lower level—the one closest to the substrate—are generally intended to constitute electrical connections in a direction perpendicular to the surface of the substrate, usually called "vias". The filled trenches belonging to the upper level—the one furthest from the substrate—are especially intended to constitute electrical connections in directions parallel to the surface of the substrate, usually called tracks. The present invention applies identically to the damascene process, as presented first, or to the dual damascene process.

Apart from obtaining metallic connections, the trenches produced in the electrically insulating material may be intended to form particular electrical components such as coils or inductors, especially RF coils or inductors, antennas, high-speed electrical signal transmission lines or capacitors having large plates. The contours of some of the etched trenches are therefore designed to correspond to these components. In the case of the dual damascene process, such components are generally placed in the upper level of the layer of insulating material.

For some applications, components, such as inductors, antennas, high-speed signal transmission lines or large capacitors, require that no other conducting part be present near each of these components. Indeed these components are sensitive to electrostatic coupling of the capacitive type and to inductive coupling, and their intrinsic operation, or the operation of the circuits which incorporate these components, is affected thereby. A volume of exclusion of conducting parts is therefore provided around these components, that is to say below and above these components and parallel to the surface of the substrate. Usually, the exclusion volume corresponds to a minimum distance of a few tens of microns from the contour of the component sensitive to electrostatic coupling.

The exclusion volume is occupied by the insulating material(s) used. These insulating materials may vary between two successive layers, but silica $SiO_2$ is used more often than not, or else materials having a lower dielectric permittivity of the silicon oxycarbide (SiOC) type. Optionally, each layer of insulating material may contain parts made of a different insulating material such as, for example, silicon nitride ($Si_3N_4$) or silicon carbide (SiC). This is, for example, the case in particular in the dual damascene process, in which the lower and upper levels of trenches etched in one and the same layer of insulating material, for example silica, are separated by a silicon nitride barrier parallel to the surface of the substrate. This silicon nitride barrier separates the two superposed parts of the same layer of insulating material from each other, and does so outside the zones corresponding to trenches of the lower level. Such a silicon nitride barrier makes it possible to etch, in a manner known to those skilled in the art, during a single etching step, the trenches of both levels within the layer of electrically insulating material.

The exclusion volume surrounding some of the sensitive components causes a disproportion between the respective fractions of the insulating material and of the metallic material within each layer. This is because each layer is exclusively formed from insulating material within the exclusion volume, outside the sensitive component, whereas it includes a fraction of metallic material in the zones where other electrical components are distributed.

The polishing step in damascene and dual damascene processes uses a polishing liquid, called a "slurry", and grit particles. The polishing liquid is introduced between that surface intended to be polished and a motor-driven disc having in general a plane surface and rotating in the plane of this surface. The grit particles, for example alumina grits, are either free in the polishing liquid or fixed to the surface of the motor-driven disc. The surface of the motor-driven disc is applied with a controlled pressing force against the surface of the substrate carrying the insulating material covered with metallic material. The objective of the polishing is to remove the surplus metallic material deposited on the insulating material, so as to expose parts of the insulating material between the trenches which remain filled with metallic material.

To reduce the polishing time, the polishing liquid includes chemical agents that are active with respect to the metallic material. These chemical agents modify the surface of the metallic material, forming a complex compound with certain components of the metallic material. This complex compound is then rapidly removed from the polished surface by the mechanical action of the polishing. The surplus metallic material may thus be rapidly removed, until the appearance of exposed portions of the surface of the insulating material. The insulating material is removed only slowly by the polishing, because of the absence of the complex compound formed by agents in the polishing liquid with components of the insulating material. Thus, the rate of removal of the metallic material is about 5 to 30 times higher than the rate of removal of the insulating material.

Because of this difference between the rates of removal of the metallic material and the insulating material, portions of insulating material that include different fractions of metallic material have different rates of material removal. Consequently, at the end of a polishing step, when the exposed surface includes zones of metallic material and zones of insulating material, more rapid removal of material takes place in the zones of metallic material, and therefore more material is removed therefrom, causing a surface planarity defect during polishing.

Such a loss of planarity of the surface of the insulating material occurs especially near the exclusion volumes associated with certain components. At the end of the polishing step, the upper surface of the insulating material in the exclusion volumes appears in relief with respect to the surrounding upper surface of the insulating material which incorporates parts of metallic material, creating a step or a change in level in this surface. This step or change in level may amount to 50 nanometres in height or more, and therefore causes parts of the surplus metallic material to remain, which parts cannot be removed during polishing because the grit particles cannot reach the internal angle of the step. Such parts of surplus metallic material that remain after polishing may extend as far as 200 μm from the step and cause short circuits and breakdowns during use of the electrical circuit.

U.S. Pat. No. 6,232,231 proposes to reduce, if not eliminate, the difference in material removal rate by placing metal inserts in those parts of the layer of insulating material not containing metallic circuits. These inserts or "dummies" have no function in the electrical circuit and are electrically insulated from the latter, especially from the functional metallic parts of this circuit. They are produced during the same steps of the damascene process as the metallic connections, namely during the step of etching the layer of insulating material, the step of filling with metallic material and the polishing step. These metallic inserts have the function of reducing the disproportion of the fraction of metallic material between various portions of the insulating material.

It is also known to combine such metal inserts with the dual damascene process (U.S. Pat. No. 6,214,745).

This first method of suppressing the risks of short circuits and breakdowns is incompatible with the exclusion volume surrounding components sensitive to electrostatic coupling, since the inserts themselves are metallic parts and consequently prohibited from the exclusion volume.

A second method of suppressing the risks of short circuits and breakdowns around the exclusion volume consists in providing an additional exclusion volume. Usually, such an additional exclusion volume extends the minimum distance separating certain metallic components from the component sensitive to electrostatic coupling up to 200 μm. This second method, although efficient, has the drawback of creating a large volume not used for the formation of components on top of the substrate, and this corresponds to an additional cost of the electrical circuit.

SUMMARY OF THE INVENTION

To address the above-discussed deficiencies of the prior art, it is a primary object of the present invention to reduce the defect in planarity created during polishing in the presence of exclusion volumes, while minimizing these unused volumes.

The invention provides a process for fabricating an electrical circuit, wherein successive layer treatments are carried out on top of a substrate in order to produce at least a first component in a first portion of the circuit and second components in a second portion of the circuit adjacent to the first portion.

In this process, at least a first of the layer treatments comprises the following steps:

forming, in a first electrically insulating material present on top of the substrate, compensation cavities in the first portion of the circuit and trenches corresponding to at least some of the second components in the second portion of the circuit;

covering the first insulating material with a first conducting material so as to substantially fill the compensation cavities and the trenches formed in the first insulating material;

polishing the first conducting material until exposing part of the first insulating material in the second portion; and removing the first conducting material in the first portion, and wherein at least a second of the layer treatments comprises the following steps:

forming, in a second electrically insulating material present on top of the substrate, at least one trench corresponding to the first component in the first portion of the circuit;

covering the second insulating material with a second conducting material so as to substantially fill the trench formed in the first portion; and partially removing the second conducting material until exposing part of the second insulating material in the first portion.

Thus conducting inserts, which may be metallic and correspond to the filled compensation cavities, are temporarily created in the first insulating material. These temporary inserts are used to give the first insulating material a substantially plane upper surface after the polishing of said first conducting material, that is to say a surface which has no variation in height of greater than about 30–50 nanometres with respect to the surface of the substrate. The inserts are then removed so as to form an exclusion volume around the first component.

One advantage of the process lies in the absence of any additional exclusion volume adding to the exclusion volume made around a component sensitive to electrostatic coupling.

In a typical embodiment, said first layer treatment is carried out before said second layer treatment, the second insulating material being deposited on top of the first insulating material.

The first or second insulating material present on the surface of the substrate and treated first may be an integral part of the substrate or may be deposited on the surface of the latter in the form of a layer formed in the first and second portions of the circuit. This deposition is therefore carried out during a step prior to all of the preceding layer treatments. Thus, any substrate can be used to form the electrical circuit, especially a substrate that does not initially have insulating material on its surface.

During the layer treatment associated with the second insulating material, the partial removal of the second conducting material may be carried out using various methods, especially polishing, chemical etching by means of a liquid solution or dry plasma etching. These same removal methods may also be used for removing the first conducting material in the first portion of the circuit carried out during the layer treatment associated with the first insulating material. For some of these methods, it may be useful for the compensation cavities formed in the first insulating material to be shallower than the trenches formed in the first insulating material.

In a variant, at least a third of the layer treatments comprises the following steps:

forming, in a third electrically insulating material present on top of the substrate, trenches corresponding to second components in the second portion of the circuit;

covering the third insulating material with a third conducting material so as to substantially fill the trenches formed in the third insulating material;

polishing the third conducting material until exposing some of the third insulating material in the second portion, in such a way that the surface of the third insulating material becomes higher in the first portion than in the second portion;

etching first cavities in the third insulating material in the first portion of the circuit in such a way that the first cavities have their bottoms deeper than the level of said surface of the third insulating material in the second portion of the circuit.

In this variant, said first layer treatment, carried out after said third layer treatment, starts with a step of depositing the first insulating material in the form of a layer covering the third insulating material in the first and second portions of the circuit so that the surface of the first insulating material has second cavities conforming substantially to the first cavities and constituting said compensation cavities.

The invention also relates to an electrical circuit fabricated using a process as described above. Such a circuit, when it is reproduced for mass production, exhibits improved reproducibility as regards the superposition of the layers and has a lower risk of short circuits appearing during its use.

The invention also relates to a device comprising such an electrical circuit. This device may, for example, be a computing unit or a mobile communication unit, such as a portable telephone.

BRIEF DESCRIPTION OF THE DRAWINGS

Further features and advantages of the present invention will become apparent in the description below of examples of non-limiting methods of implementation, with reference to the appended drawings in which:

FIGS. 1-$a$ to 1-$f$ illustrate steps of a first method of implementing the process of the invention;

FIG. 2-$a$ shows an example of a structure fabricated according to the process of the invention;

FIGS. 2-$b$ and 2-$c$ illustrate two steps of a second method of implementing the process of the invention, designed to obtain the structure of FIG. 2-$a$;

FIGS. 3-$a$ to 3-$g$ illustrate steps of a variant of the method of the invention;

FIGS. 4-$a$ to 4-$f$ illustrate steps of a third method of implementing the process of the invention;

FIGS. 5-$a$ and 5-$b$ illustrate two steps of the first method of implementing the process of the invention combined with the dual damascene process.

DETAILED DESCRIPTION OF THE INVENTION

All these figures, apart from FIG. 1-$f$, are sectional views of planar substrates on which layers incorporating metallic components are formed. A surface S1 of each of these substrates bearing the structure is taken to be directed upwards in the figures. The words "on", "beneath", "on top of", "upper" and "lower" used below refer to this orientation. D denotes a direction perpendicular to the surface S1. In all the figures, the proportions of the different parts of elements shown have not been drawn to scale in order to make them more legible. Moreover, identical numerical references used in two different figures correspond to identical meanings.

FIG. 1-$a$ shows a substrate 1, for example a silicon substrate, bearing on a planar surface S1 a layer 2 of insulating material, for example silica $SiO_2$. The layer 2 is obtained by means of one of the methods known to those skilled the art, particularly a method for depositing silica with a short deposition time. Such methods are, for example, chemical vapour deposition (CVD) or plasma-enhanced chemical vapour deposition (PECVD) which use, for example, the compound tetraethoxysilane $Si-(OC_2H_5)_4$ (or TEOS) as main reactant. The layer 2 has a thickness of several hundred nanometres, for example.

Figure 1A:
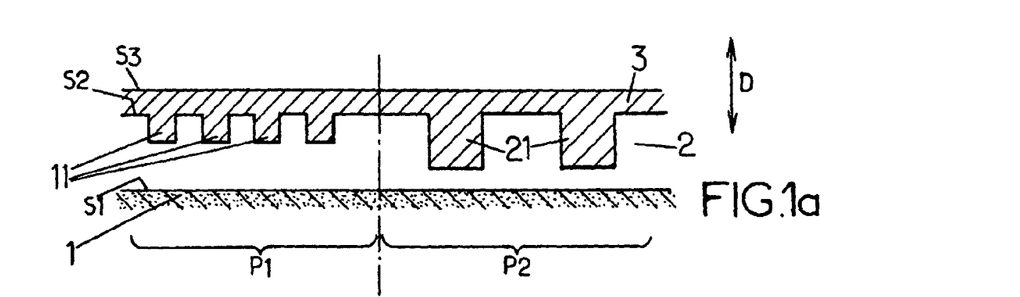

Compensation cavities 11 and trenches 21 are then etched in the silica layer 2, at the upper surface S2 of the layer 2. The cavities 11 and trenches 21 are etched using one of the methods known to those skilled in the art, such as plasma etching, called "dry etching", or etching using a chemical solution, called "wet etching". Masks (not shown) are deposited in succession on the surface S2 in order to define the contours of the cavities 11 and of the trenches 21 in the plane of the surface S2. The use of these masks also makes it possible, according to FIG. 1-$a$, to etch the cavities 11 down to a depth in the direction D of less than the depth of the trenches 21 in the direction D.

The cavities 11 are intended for producing, during a subsequent step of the process, metal inserts distributed in a portion P1 of the circuit. They have, for example, a depth of a few hundred nanometres, or less. The mask used for etching the cavities 11 is removed after this etching operation.

The trenches 21 are intended for forming metallic components of the track or via type in a second portion P2 of the circuit. In the case of the damascene process, the trenches 21 have, for example, a depth of a few hundred nanometres, or less. The mask used for etching the trenches 21 is removed after this etching operation.

A metallic material, for example copper, but possibly also aluminium, silver, tungsten, tantalum, titanium, molybdenum, etc. or an alloy, is then deposited on the surface S2 so as to completely the fill the cavities 11 and the trenches 21. To ensure that the cavities 11 and the trenches 21 are completely filled, the metal deposition is continued so as to produce a layer 3 that completely covers the surface S2, forming a surplus of deposited metal compared to filling of the cavities 11 and trenches 21.

Figure 1B:
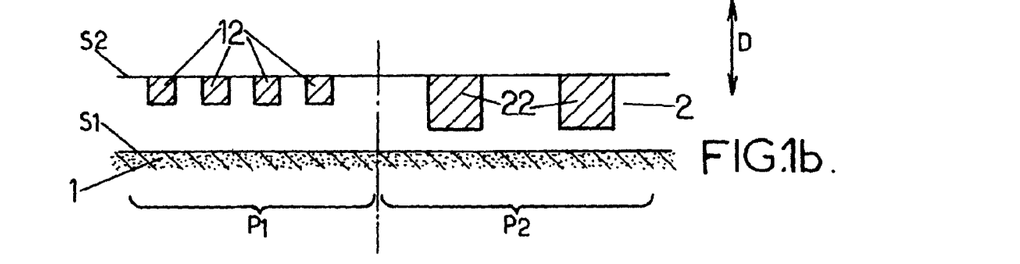

The surplus metal deposited is then removed by polishing, by applying a flat polishing disc against the upper surface S3 of the layer 3, with a controlled pressing force oriented in the direction D. This polishing uses a polishing liquid (or slurry) particularly suitable for rapidly removing copper. During this polishing operation, the upper surface S3 of the metal layer 3 is progressively lowered in the direction D, towards the substrate 1, while remaining planar and parallel to the surface S1 of the substrate. This progressive polishing, keeping a planar surface S3, results from the fact that a layer consisting uniformly of homogenous metal is removed. The configuration in FIG. 1-b is then obtained, in which metal inserts 12 and 22, filling the cavities 11 and the trenches 21 respectively, are isolated.

Figure 1C:
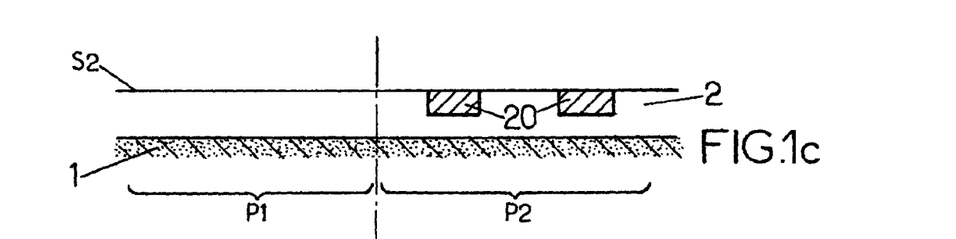

The polishing is continued under unchanged conditions so as to lower the surface S2 towards the substrate 1, in the direction D. The material removed is then inhomogenous, consisting of metal corresponding to the inserts 12 and 22 and of silica constituting the layer 2 outside the inserts 12 and 22. By means of a suitable arrangement of the inserts 12 in the portion P1, substantially equal average rates of material removal are obtained during this second polishing step in the two portions P1 and P2. In this way, the surface S2 is lowered uniformly, remaining planar and parallel to the surface S1. In the method of implementing the process of the invention given here, the polishing is stopped when the surface S2 reaches a distance equal to or just less than the height of the bottoms of the inserts 12 with respect to the surface S1. The configuration illustrated in FIG. 1-c is then obtained. In this configuration, the surface S2 is completely devoid of any metallic part in the portion P1 but has, in the portion P2, residual inserts 20 which form, for example, electrical connection tracks.

In an alternative method of implementation, the polishing is stopped before the surface S2 reaches the bottoms of the inserts 12. The residual metallic parts of the inserts 12 are then removed, during an additional removal step, by a process other than polishing, for example a wet etching or dry etching process.

Figure 1D:
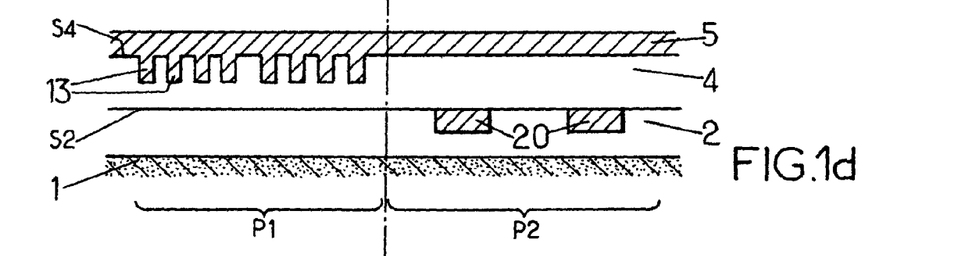

A second layer of insulating material 4, which may for example be a second layer of silica, is then deposited on the surface S2 of the layer 2. This layer 4 covers in particular the tracks 20. The upper surface S4 of the layer 4 is etched, for example using the same etching method as that used at the upper surface S2 of the layer 2. Trenches 13 are thus formed in the surface S4, in the portion P1. Optionally, cavities and/or trenches (not shown) may also be etched in the layer 4 in the portion P2, which cavities and/or trenches may be intended to correspond to metallic components present in the final electrical circuit, or to obtain a planar surface S4. The layer 4 thus etched is then covered with a layer 5 of metal, for example copper. This layer 5 includes volumes of metal that completely fill the trenches 13 and a surplus of metal present over the entire upper surface S4 of the layer 4 (FIG. 1-d).

Figure 1E:
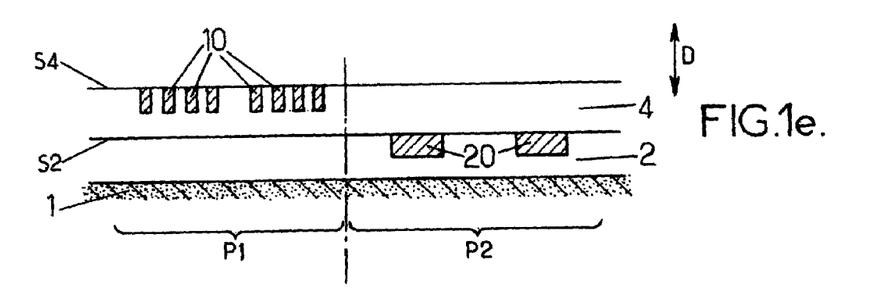

The surplus metal is removed from the layer 5, for example by polishing, so as to expose the surface S4 of the insulating material of the layer 4 between the metal-filled trenches 13. FIG. 1-e illustrates the configuration obtained. In this configuration, the substrate 1 is covered with two silica layers 2 and 4. The layer 2 incorporates the metallic connections 20 in the portion P2 and the layer 4 incorporates said particular component, labelled 10 in FIG. 1-e, in the portion P1. Because of the temporary presence of the metal inserts 12 during polishing of the silica layer 2, the upper surface S2 of the layer 2 is planar, so as to obtain a planar base beneath the layer 4 and for the component 10. The inserts temporarily placed in the layer 2 in the portion P1 have been entirely removed so that an exclusion volume is present beneath the component 10.

FIG. 1-f is a top view of the substrate 1 bearing the structure formed in relation to FIGS. 1-a to 1-e. The figure consequently shows the upper surface S4 of the second silica layer 4, which incorporates the component 10 in the portion P1. In this figure, the component 10 is an inductor in the form of an octagonal spiral. An electrical connection (not shown), connecting the central end of the inductor 10, may be provided during the process for fabricating the above-mentioned structure, or it may be added using any other method known to those skilled in the art. Shown by dotted lines in the portion P2 are two parallel tracks 20 corresponding to their arrangement within the first silica layer 2 covered by the second silica layer 4.

Figure 1F:
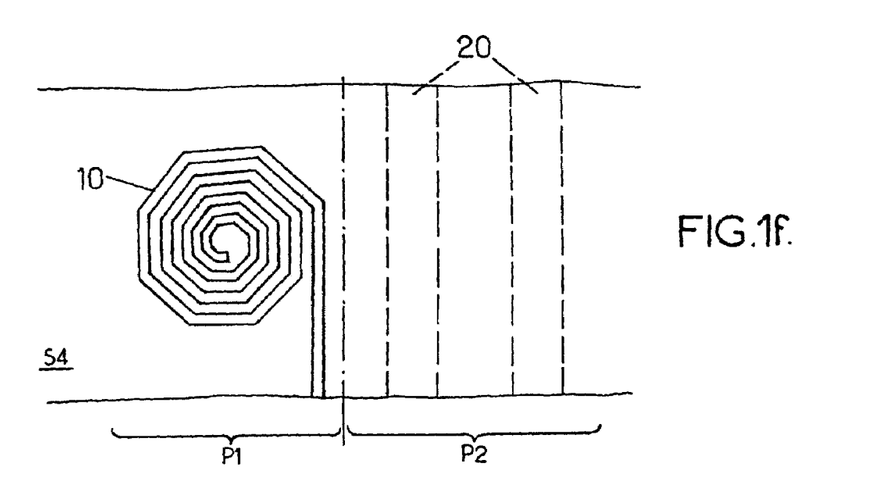

Thanks to the process of the invention, which avoids having to use an additional exclusion volume, the tracks 20 of the inductor 10 may be separated by a distance of less than 200 μm, especially less than 50 μm. To do this, during formation of the structure, a distance of less than 200 μm, preferably less than 50 μm while still remaining sufficient to prevent any electrostatic coupling between the tracks 20 and the inductor 10, is left between some of the trenches 13 corresponding to the inductor 10 and the trenches 21 formed in the silica layer 2.

The temporary inserts 12 may have dimensions in the plane of the surface S2 of about 0.5 μm at least, and two adjacent inserts are, for example, separated by distances of the same order of magnitude. The density of the metal inserts 12 is adjusted in a known manner so as to obtain, after polishing, a planar surface S2, that is to say one that has height variations of less than 30–50 nanometres in the direction D. Likewise, each point on the contour of a metallic component intended to belong to the final electrical circuit is separated from at least one metal insert by a maximum distance of 10 to 50 μm. Thus, the surface S2 is maintained strictly planar during polishing. On account of the dimensions of the inductor 10 and of the tracks 20, photolithography masks used to form the masks for etching the layer 2 may have only a limited precision. Likewise, these photolithography masks may also be positioned approximately with respect to the surface S2, allowing the use of simplified and therefore less expensive alignment tools. The time needed to achieve such an alignment is therefore shorter, thereby reducing the cycle time and the cost corresponding to the etching steps.

Figure 2A:
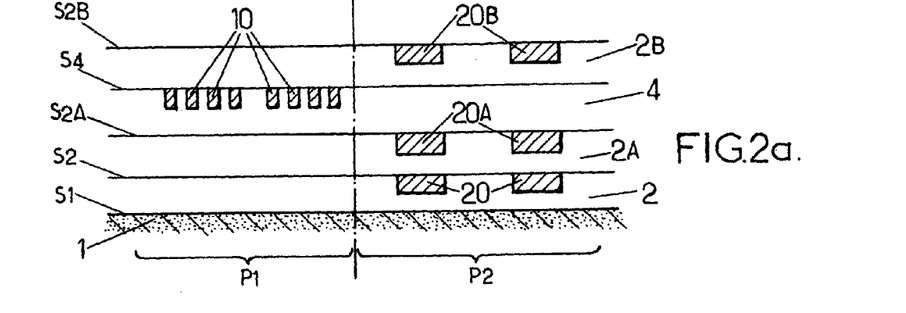

FIG. 2-a shows a cross section of a substrate 1 bearing a structure formed using the process of the invention. In this structure, four layers of insulating material, each one possibly being a silica layer, are superposed on the surface S1 of the substrate 1. These layers correspond to the labels 2, 2A, 4 and 2B, listed in order starting from the substrate 1. The layers 2, 2A and 2B include respective metallic components 20, 20A and 20B in the portion P2. These metallic components 20, 20A and 20B are placed within the upper surfaces S2, S2A and S2B of the layers 2, 2A and 2B, respectively. The layer 4 incorporates a component 10 which, as in the previous example, may be an inductor composed of several turns placed within the upper surface S4 of the layer 4. The component 10 is placed in the portion P1 of the circuit. The portion P1 is also devoid of any other metallic part in the four layers 2, 2A, 4 and 2B so as to present an exclusion volume around the component 10. In this example, the additional layer of components 20B is placed, at a higher level with respect to the surface of the substrate, than the layer 4 that incorporates the component 10.

All the steps for forming the structure shown in FIG. 2-a will not be described now, given that they are repetitions of the steps described in the previous example with reference to FIGS. 1-a to 1-e. The layers 2, 2A and 2B are similar to the layer 2 of this previous example and each layer is obtained by a sequence of steps identical to those already described in relation to FIGS. 1-a, 1-b and 1-c.

Figure 2B:
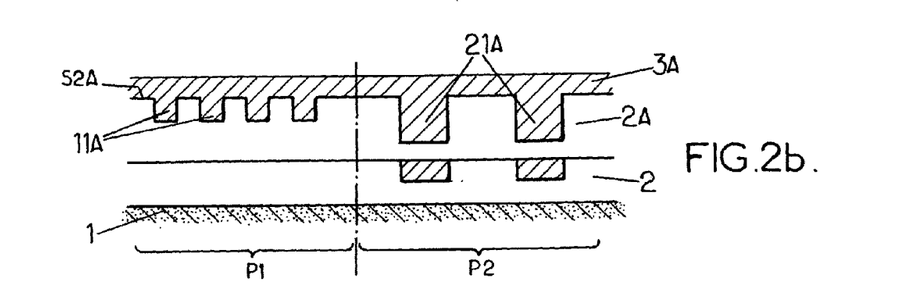

As an example, FIG. 2-b illustrates the formation of the layer 2A, showing the structure after the metallic material has been deposited. At this point in the process, the layer 2 is complete and the layer 2A has been etched so as to have, at its upper surface S2A, on the one hand, cavities 11A corresponding to temporary inserts in the portion P1 and, on the other hand, trenches 21A in the portion P2 corresponding to metallic components present in the final electrical circuit. Depending on the design of the electrical circuit, the metallic components 20 and 20A placed in the layers 2 and 2A in the portion P2 may differ between the two layers. The trenches 21A therefore differ from the trenches 21 according to the metallic components to which they correspond, respectively. The cavities 11A etched in the layer 2A may be identical to the cavities 11 in the layer 2, given that they fulfil the same temporary function of compensating for the fraction of metallic material with respect to the fraction of insulating material in the portion P1. This compensation makes it possible to obtain a planar surface S2A after the layer 2A has been completely polished. FIG. 2-b also shows the metallic layer 3A for filling the cavities 11A and the trenches 21A, before said layer 3A is polished.

Figure 2C:
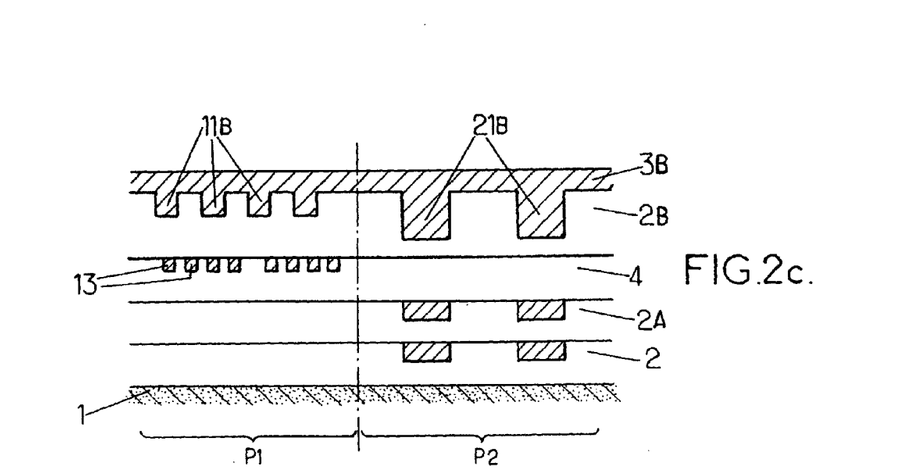

FIG. 2-c corresponds to the formation of the layer 2B, and in the same intermediate state of formation as that of layer 2A in FIG. 2-b. The layer 4 is therefore complete and incorporates metal-filled trenches 13 corresponding to the component 10. The layer 2B has cavities 11B and trenches 21B similar to the cavities 11A and the trenches 21A respectively. These cavities and trenches are filled with the metallic material of the upper layer 3B.

Figure 3A:
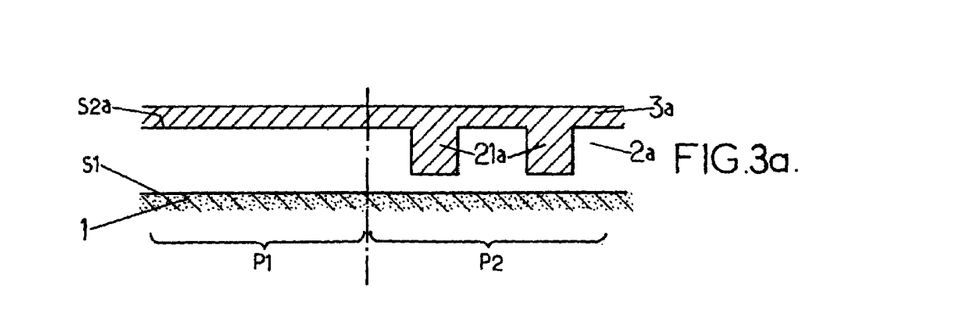

In a variant of the process of the invention, a first layer 2a of insulating material, again silica for example, is formed on the surface S1 of a substrate 1. Trenches 21a are etched in the upper surface S2a of the layer 2a. The trenches 21a are located in a portion P2 of the circuit, outside a portion P1 of the circuit. The whole assembly is then covered with a layer 3a of metallic material, which in particular fills the trenches 21a, in accordance with FIG. 3-a.

The metallic layer 3a is then polished using, as previously, a polishing liquid designed to obtain a high rate of removal of the metal. To ensure that no part of the metallic layer 3a remains above the layer 2a of insulating material outside the trenches 21a, the polishing is continued, during an additional polishing step, so as to remove an upper part of the insulating material of the layer 2a. The upper surface S2a of the layer 2a is then lowered towards the substrate 1, in the direction D.

Figures 3B, 3C:
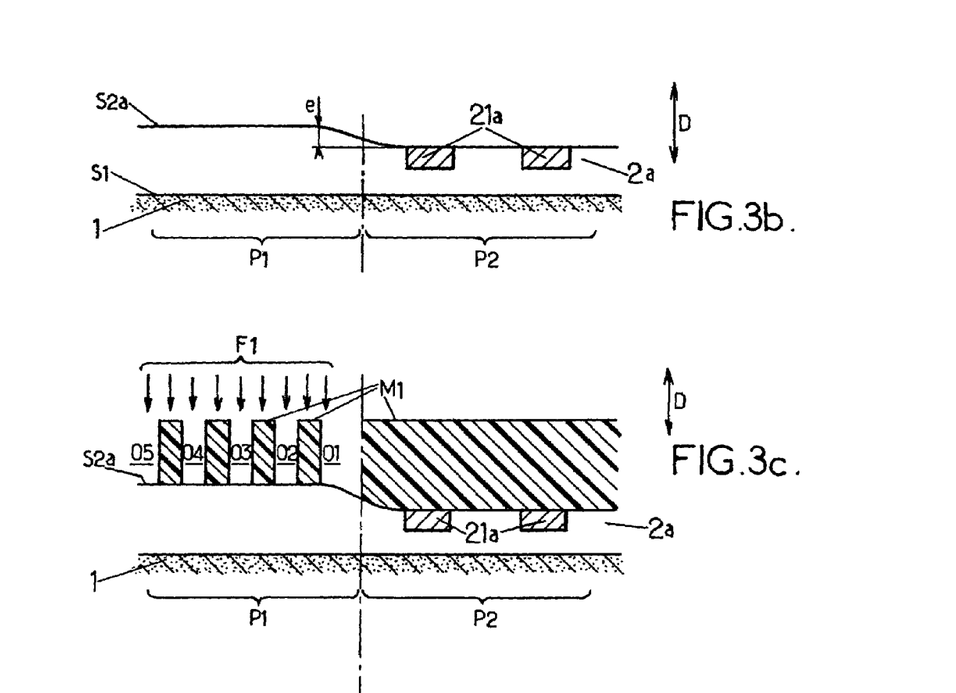
Figure 3D:
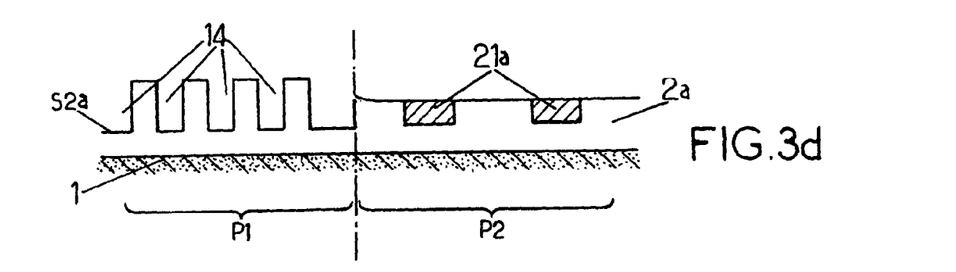

After the additional polishing, the surface S2a is at a greater height in the portion P2 than in the portion P1 with respect to the surface S1 of the substrate 1. This height difference is due to the presence of metallic material in the trenches 21a in the portion P2 and to the absence of metallic material in the portion P1. This is because the presence of a fraction of metallic material within the insulating material, for example silica, at an abrasion surface increases the overall rate at which material, whether insulating or metallic, is removed, while maintaining a locally planar surface. This results in the difference in level e shown in FIG. 3-b.

The surface S2a is then covered with an etching mask M1, as illustrated in FIG. 3-c. This mask completely covers the portion P2 and has apertures A1–A5 in the portion P1. These apertures have, for example, sides of at least about 500 nanometres and are separated by a distance, for example, of at least 500 nanometres. A directional plasma etching (dry etching) operation is then carried out. During this etching operation, a directional flux F1 of accelerated particles, parallel to the direction D, penetrates the apertures A1-A5 and progressively ablates some of the insulating material of the layer 2a in line with the apertures A1-A5. Cavities 14 are therefore obtained (FIG. 3-d) located at the positions of the apertures A1–A5 in the mask M1. The mask M1 is then removed.

Figure 3E:
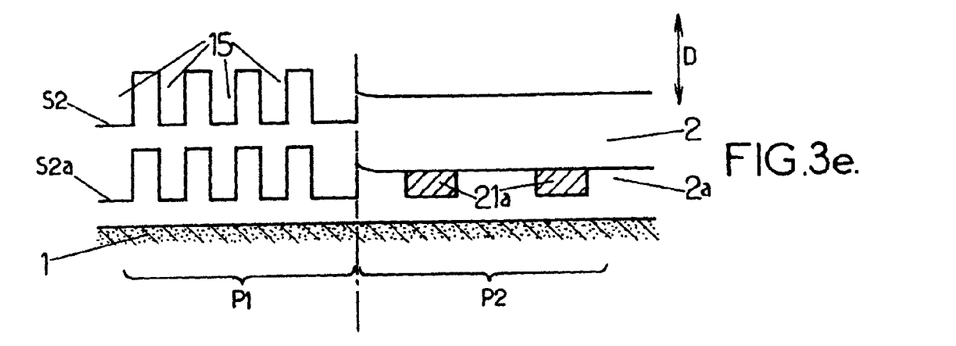

The fabrication process then repeats the steps already described. A layer 2 of insulating material is deposited on the surface S2a (FIG. 3-e). Suitable deposition conditions, known to those skilled in the art, are adopted during this deposition so as to obtain what is called a "conformal" layer 2. Such a layer has an upper surface S2 which reproduces the hollows in and the reliefs on the surface S2a on which it is deposited. Thus, the surface S2 is planar in the portion P2 but has, in the portion P1, cavities 15 that reproduce the cavities 14 initially present in the surface S2a. The surface S2 is therefore identical to the surface S2a, but offset with respect to the latter, in the direction D, by a distance corresponding to the thickness of the layer 2.

Figure 3F:
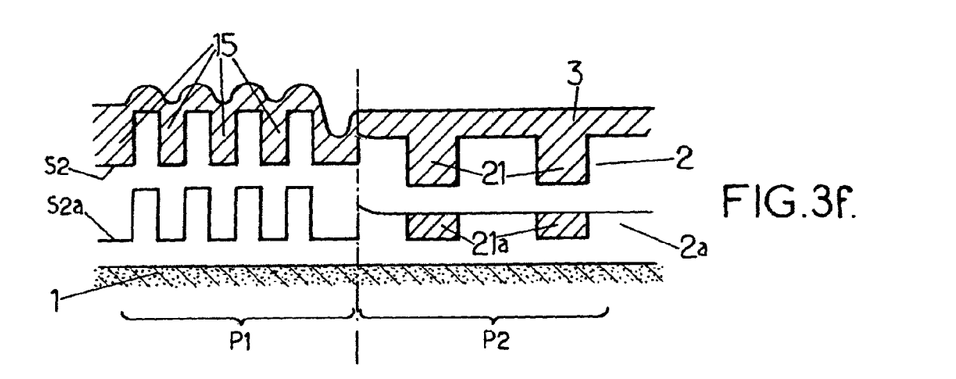

The cavities 15 thus obtained are similar to the compensation cavities 11 of FIG. 1-a. Trenches 21 are then etched in the layer 2 in the portion P2. The etching is continued until the trenches 21 have respective bottoms substantially parallel to the surface S1 of the substrate and located at a height, with respect to the surface S1 and in the direction D, that is less than the height of the bottom of the cavities 15 with respect to the surface S1. During this etching of the trenches 21, the surface S2 is completely protected in the portion P1 by the mask for defining the contours of the trenches 21. This mask is then removed and a layer of metallic material 3 is deposited so as to fill the cavities 15 and the trenches 21 (FIG. 3-f).

Figure 3G:
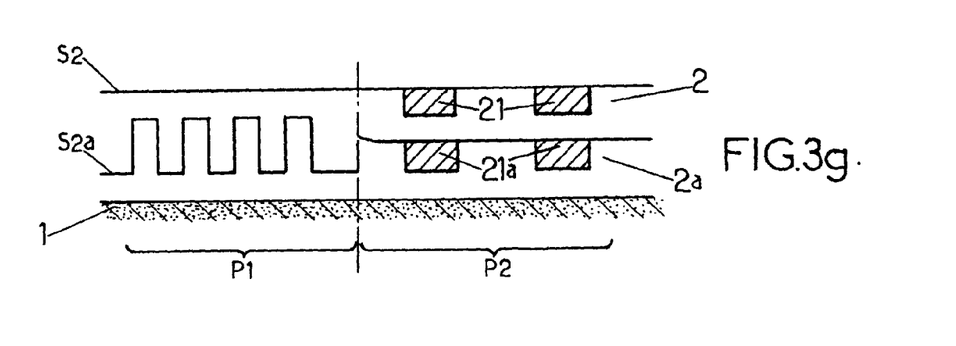

A polishing of the metallic material 3 is then carried out so as to remove the metallic material from the cavities 15 and the trenches 21. This polishing is continued until the surface S2 reaches, or just exceeds, the bottom of the cavities 15. The metal-filled cavities 15 therefore progressively disappear during the polishing and the configuration illustrated in FIG. 3-g is obtained. During this polishing, the metal-filled cavities 15 constitute temporary metal inserts, similar to the inserts 12 of FIG. 1-b, by means of which the surface S2 formed during the polishing is planar.

The formation of the structure on top of the surface S2 may then be completed using the steps already described in relation to FIGS. 1-d and 1-e, or in relation to FIGS. 2-a to 2-c.

The third method of implementing the process of the invention that will now be described is more particularly intended for the production of several components within the same layer of insulating material, one of which is particularly sensitive to capacitive or inductive coupling. To take an example, this sensitive component is a high-speed electrical signal transmission line.

FIG. 4-a shows a silicon substrate 1 covered over its entire surface S1 with a first layer 2 of substantially uniform insulating material, for example silica about 1 µm in thickness. Compensation cavities 11 and at least one trench 21 are then etched in the upper surface S2 of the layer 2, by depositing an etching mask on the initially planar surface S2, the mask having apertures corresponding to the cavities 11 and to the trench 21, respectively. The surface S2 thus partially covered is exposed to an etching plasma that simultaneously forms the cavities 11 in at least one portion P1 of the substrate 1 and the trench 21 in a portion P2 of the substrate. After the etching operation, the cavities 11 and the trench 21 have the same depth in the direction D, for example a few hundred nanometres. As previously, the layer 2 is covered with a metallic layer 3 so as to fill the cavities 11 and the trench 21 with a surplus of metallic material on the surface S2, located higher than the upper level of aperture of the cavities 11 and the trench 21.

The surplus metal 3 is then removed by polishing until exposing the surface S2 between the cavities 11 and around the trench 21 (FIG. 4-b). Optionally, this polishing is continued beyond the appearance of the insulating material of the layer 2 so as to guarantee removal of any metallic part from the surface S2 outside the cavities 11 and the trench 21. Thanks to the provision of the compensation cavities 11, the surface S2 during this polishing is maintained parallel to the surface S of the substrate 1 and, outside the cavities 11 and the trench 21, with a height, in the direction D, that is uniform over both portions P1 and P2. The cavities 11 and the trench 21 then become metal inserts, respectively 12 and 20, that are isolated from one another. The insert 20 constitutes a definitive component of the final circuit.

Figure 4A:
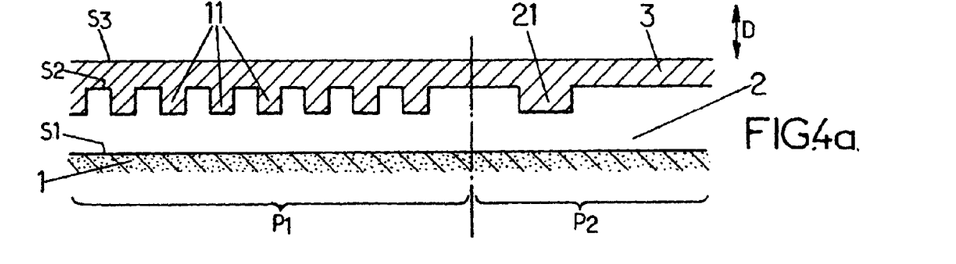
Figure 4B:
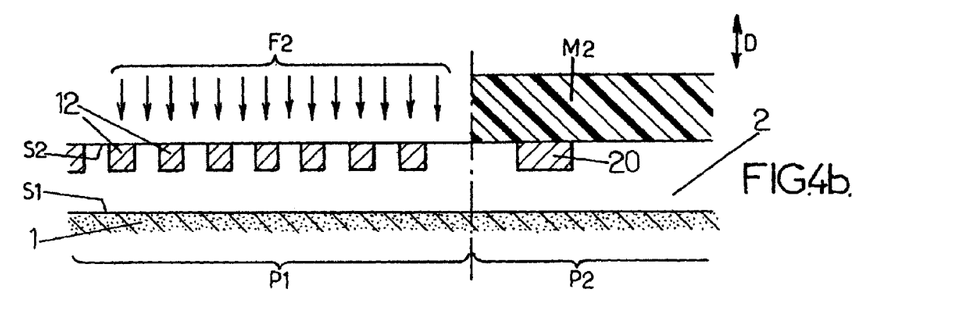

A resist mask M2 is then produced by lithography in the portion P2 so as to cover at least the insert 20. No mask is left in the portion P1. The surface S2 thus partially covered with the mask M2 is exposed to a plasma for selectively etching the metallic material 3. Such a plasma comprises a flux F2 of particles accelerated in the direction D by means of a suitable electrical voltage in order to etch the metallic material 3 without etching the material of the layer 2, which is more resistant to etching than the metallic material 3. The inserts 12 are thus completely stripped of the metallic material 3. Chemical etching also allows the metallic material 3 to be completely removed. The mask M2 is then removed.

A second layer of insulating material 4, again silica for example, is deposited on top of the layer 2 (FIG. 4-c). The layer 4 is mechanically polished so as to obtain a planar upper surface S4 parallel to the surface S.

Figure 4C:
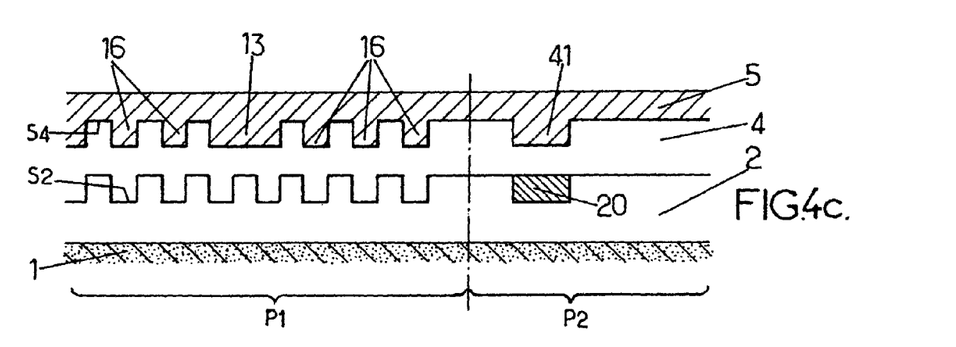
Figure 4D:
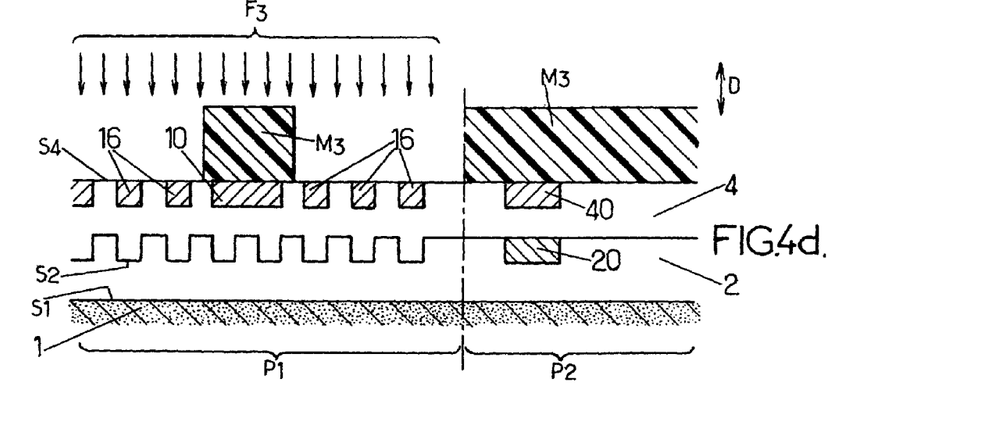
Figure 4E:
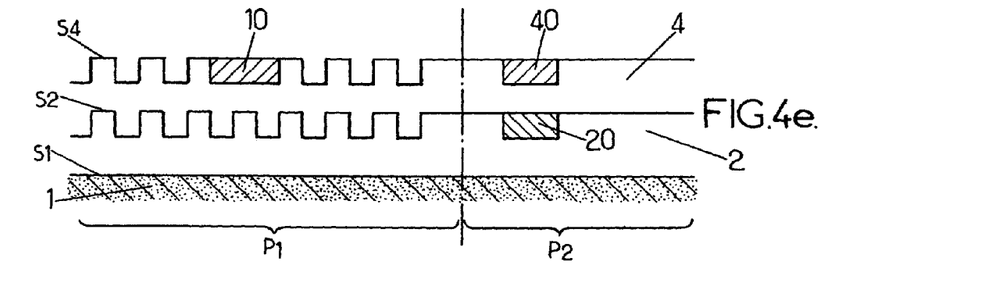
Figure 4F:
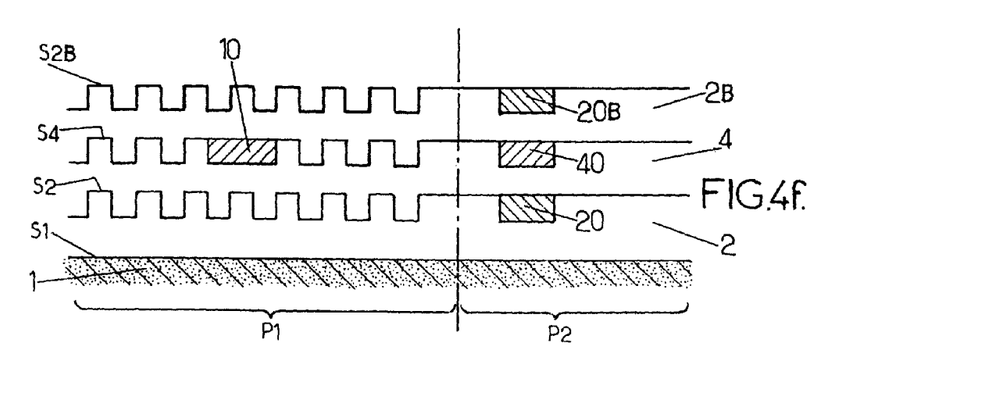

Another method of obtaining the planar surface S4 parallel to the surface S, which does not use polishing of the layer 4 after it has been deposited, consists in having previously formed, in the layer 2, compensation cavities 11 in a pattern closely spaced enough for this pattern not to appear at the surface S4 during deposition of the layer 4. The planar surface S4 is then obtained directly during deposition of the insulating material 4, making it possible to avoid the polishing step. This is in particular the case when cavities 11 are formed in the layer 2, for example square cavities having sides of at most 400 nanometres with a density corresponding to a degree of occupancy of the surface S2 of at least 25%.

Compensation cavities 16 and a trench 13 are then formed in the layer 4 in the portion P1, together with at least one other trench 41 in the portion P2. The cavities 16 and the trenches 13 and 41 are preferably formed simultaneously during a single etching step using an etching mask deposited on the surface S4 which includes apertures corresponding to the cavities 16 and to the trenches 13 and 41, respectively. The mode of etching used is, for example, directional dry etching.

After the etching, the cavities 16 and the trenches 13 and 41 have identical depths in the direction D, these being set by the duration of the etching step. The shape of the trench 13 corresponds to that desired for the high-speed electrical signal transmission line within the final circuit. As in the methods of implementing the process that were described above, the trench 41 corresponds to a definitive component in the second portion of the circuit.

The surface S4 is then covered with another metallic material 5 (FIG. 4-c) so as to completely fill the cavities 16 and the trenches 13 and 41 with a surplus of metallic material located higher than the upper level of openings of the cavities 16 and of the trenches 13 and 41. In the same way as that described above, the surplus metallic material 5 is removed by polishing until exposing the layer 4 in the portion P2 outside the trench 41 and in the portion P1 around the trench 13. The trenches 13 and 41 are then isolated and become the metal inserts 10 and 40, respectively.

A mask M3 is then placed on top of the portion P2 of the circuit, in particular covering the insert 40, and on top of the insert 10 in the portion P1 (FIG. 4-d). The conducting material 5 is removed by selective etching in those parts of the surface S4 which are not covered by the mask M3. This removal may be carried out by dry etching by means of a directional flux F3 of particles directed onto the surface S4 parallel to the direction D. It may also be carried out by chemical etching by means of a liquid solution incorporating reactants suitable for dissolving the metallic material 5. The etching step is continued until the metallic material 5 has been completely removed from the compensation cavities 16.

The mask M3 is then removed, leaving the inserts 10 and 40 intact, as illustrated in FIG. 4-e. A third layer of insulating material 2B can then be deposited on the surface S4, covering the inserts 10 and 40, and then the upper surface S2B of the layer 2B is planarized by polishing in the same way as in the case of the layer 2. As in the case of the layer 4, the planar surface S2B parallel to the surface S may be obtained directly during deposition of the layer 2B, without carrying out any polishing, if the compensation cavities 16 formed in the layer 4 constitute a sufficiently closely spaced feature.

The formation of the circuit may then be continued in the manner already described with reference to FIG. 2-c, in particular for producing an insert 20B in the portion P2 corresponding to a component of the final circuit (FIG. 4-f).

In this embodiment, a high-speed electrical signal transmission line has been taken as an example of an isolated component in the portion P1 so as to prevent it from being disturbed by other components placed too close to it on the substrate of the circuit. In the same way, the process may be applied to the production of an antenna or a capacitor requiring identical isolation precautions.

The above examples of how the process of the invention is implemented have been described, for the sake of simplicity, within the context of the damascene process. In the same way, each of the steps of the process may be combined with the dual damascene process. This combination with the dual damascene process uses, in a similar manner, inserts placed in that portion of the circuit which is intended to bear a component sensitive to electrostatic coupling. These inserts are then removed so as to leave an exclusion volume beneath, and possibly above, the sensitive component. The use of the dual damascene process allows more complex electrical circuits to be obtained than the damascene process, without increasing the area of the substrate needed for these circuits.

Figure 5A:
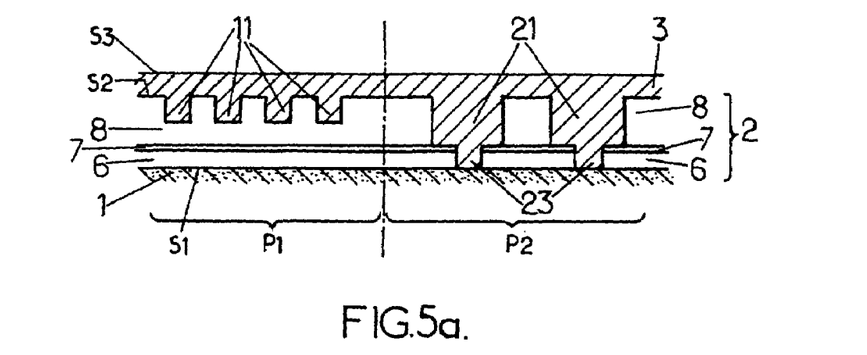
Figure 5B:
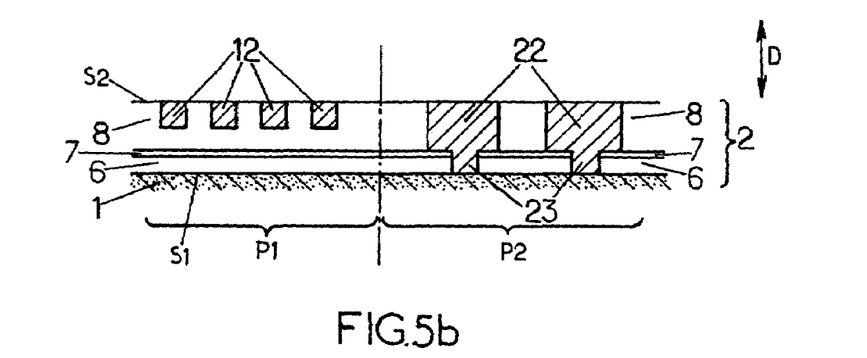

As an illustration, FIGS. 5-a and 5-b correspond to FIGS. 1-a and 1-b in the case of the dual damascene process, respectively. They comprise elements identical to those in FIGS. 1-a and 1-b, except for the structure of the layer 2. In FIGS. 5-a and 5-b, the layer 2 comprises three superposed elementary layers 6, 7 and 8 formed from respective electrically insulating materials. The elementary layers 6 and 8 are, for example, made of silica $SiO_2$ and have respective thicknesses of a few hundred nanometres. The intermediate layer 7, usually called a stop layer, is, for example, made of silicon nitride $Si_3N_4$ and has a thickness of a few tens of nanometres, for example. In the dual damascene process, the stop layer 7 is not impaired by the etching process used to produce cavities and trenches in the elementary silica layers 6 and 8.

Trenches 21 are etched in a known manner in the elementary layer 8, over the entire thickness of the latter, these trenches having extensions 23 in the elementary layer 6. These extensions 23 extend through the stop layer 7. In the same way as that described with reference to FIG. 1-a, cavities 11 are etched in the elementary layer 8. All of the cavities 11 and the trenches 21, and also the extensions 23, are filled with metal during the deposition of the metallic layer 3.

The polishing, already described, is then carried out, which removes the metal parts present on top of the elementary layer 8 outside the cavities 11 and the trenches 21. The metal inserts 12 and 22 are therefore formed, isolated from each other, without the extensions 23 being modified. The inserts 12 make it possible to maintain a planar surface S2 during the continuation of the polishing, while being completely eliminated. The inserts 22, within the elementary layer 8, constitute, for example, metal tracks for electrical connections. The extensions 23, within the elementary layer 6, constitute vias which make electrical connections between tracks and components superposed in the direction D.

Figure 6:
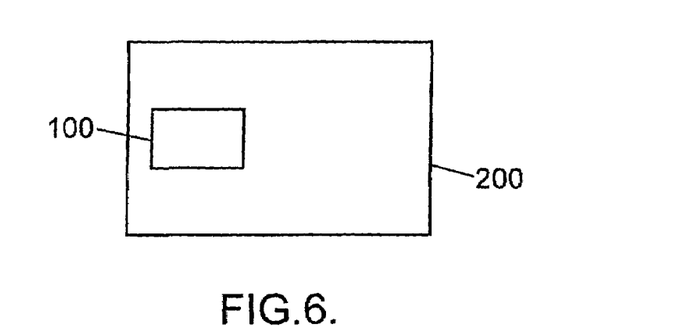
FIG. 6 is a schematic diagram of a device according to the invention.

The process described above is well suited to the production of integrated circuits intended for various applications. Such a circuit may constitute, for example, a microprocessor, a microcontroller, a peripheral device, an application specific integrated circuit (ASIC), etc., incorporating a relatively great diversity of functions. FIG. 6 illustrates such a circuit 100 forming part of an electronic device 200. This device 200 consists, for example, of a computer, a peripheral apparatus, fixed or mobile communication equipment, domestic, professional or industrial electronic equipment, equipment on board a vehicle, a measurement or monitoring instrument, etc., in which the circuit 100 is mounted by techniques well known to those skilled in the art. It may also consist of a subunit such as, for example, an electronic card intended to form part of a much larger system.

What is claimed is:

1. A process for fabricating an electrical circuit, wherein successive layer treatments are carried out on top of a substrate in order to produce at least a first component in a first portion of the circuit and second components in a second portion of the circuit adjacent to the first portion, wherein at least a first of the layer treatments comprises the following steps:

forming, in a first electrically insulating material present on top of the substrate, compensation cavities in the first portion of the circuit and trenches corresponding to at least some of the second components in the second portion of the circuit;

covering the first insulating material with a first conducting material so as to substantially fill the compensation cavities and the trenches formed in the first insulating material;

polishing the first conducting material until exposing part of the first insulating material in the second portion; and removing the first conducting material in the first portion; and wherein at least a second of the layer treatments comprises the following steps:

forming, in a second electrically insulating material present on top of the substrate, at least one trench corresponding to the first component in the first portion of the circuit;

covering the second insulating material with a second conducting material so as to substantially fill the trench formed in the first portion; and partially removing the second conducting material until exposing part of the second insulating material in the first portion.

2. The process according to claim 1, wherein said first layer treatment is carried out before said second layer treatment, the second insulating material being deposited on top of the first insulating material.

3. The process according to claim 2, wherein at least a third of the layer treatments comprises the following steps:

forming, in a third electrically insulating material present on top of the substrate, trenches corresponding to second components in the second portion of the circuit;

covering the third insulating material with a third conducting material so as to substantially fill the trenches formed in the third insulating material;

polishing the third conducting material until exposing some of the third insulating material in the second portion, in such a way that the surface of the third insulating material becomes higher in the first portion than in the second portion;

etching first cavities in the third insulating material in the first portion of the circuit in such a way that the first cavities have their bottoms deeper than the level of said surface of the third insulating material in the second portion of the circuit, wherein said first layer treatment, carried out after said third layer treatment, starts with a step of depositing the first insulating material in the form of a layer covering the third insulating material in the first and second portions of the circuit so that the surface of the first insulating material has second cavities conforming substantially to the first cavities and constituting said compensation cavities.

4. The process according to claim 1, wherein the partial removal of said second conducting material comprises polishing, chemical etching by means of a liquid solution or dry plasma etching.

5. The process according to claim 1, wherein the cavities formed in the first insulating material are shallower than the trenches formed in the first insulating material.

6. The process according to claim 5, wherein the removal of said first conducting material in the first portion comprises a polishing step.

7. The process according to claim 1, wherein the removal of said first conducting material in the first portion comprises a step using chemical etching by means of a liquid solution or dry plasma etching.

8. The process according to claim 1, wherein, during said second layer treatment:

compensation cavities are furthermore formed in said second insulating material; and the compensation cavities formed in said second insulating material are substantially filled with the second conducting material;

and wherein said second layer treatment furthermore includes, after the partial removal of the second conducting material, a removal of the second conducting material from the compensation cavities that are formed in said second insulating material.

9. The process according to claim 8, wherein the removal of the second conducting material from the compensation cavities that are formed in said second insulating material is carried out by masking the trench corresponding to the first component.

10. The process according to claim 8, wherein the removal of the second conducting material from the compensation cavities that are formed in said second insulating material comprises chemical etching by means of a liquid solution or dry plasma etching.

11. The process according to claim 8, wherein the compensation cavities formed in said second insulating material are formed simultaneously with the trench corresponding to the first component.

12. The process according to claim 8, wherein, during said second layer treatment, trenches corresponding to at least some of the second components are furthermore formed in said second insulating material in the second portion of the circuit, and wherein the partial removal of the second conducting material is carried out so as to furthermore expose a part of the second insulating material in the second portion.

13. The process according to claim 12, wherein the removal of the second conducting material from the compensation cavities that are formed in said second insulating material is carried out by masking the trench corresponding to the first component and the trenches corresponding to at least some of the second components.

14. The process according to claim 1, wherein said first component is an inductor, an antenna, a high-speed electrical signal transmission line, or a capacitor.

15. The process according to claim 1, wherein said first and/or second electrically insulating materials deposited as respective layers are polished before the formation of the compensation cavities and the trenches in each of said first and/or second insulating materials, respectively.

16. The process according to claim 1, wherein said first and/or second electrically insulating materials are deposited in the form of respective layers each having a plane upper surface at the end of the deposition of each of said first and/or insulating materials.

17. A circuit fabrication process wherein a first layer of treatments comprise the steps of:
   forming, in a first insulating material present on a substrate:
      (i) compensation cavities in a first portion of a circuit, and
      (ii) trenches corresponding to components in a second portion of said circuit;
   filling substantially said compensation cavities and said trenches with a first conducting material;
   polishing said first conducting material to expose said first insulating material in said second portion; and
   removing said first conducting material in said first portion; and
wherein a second layer of treatments comprises the steps of:
   forming, in a second insulating material present on said substrate, a trench corresponding to a component in said first portion;
   filling substantially said trench formed in said first portion with a second conducting material; and
   removing partially the second conducting material until exposing part of the second insulating material.

18. The process according to claim 17 wherein said second insulating material is deposited on top of said first insulating material.

19. The process according to claim 18 wherein said first layer treatment is carried out after a third layer treatment and further comprises the step of depositing said first insulating material in the form of a layer covering a third insulating material in said first and second portions of said circuit where said surface of said first insulating material has cavities conforming substantially to said first cavities and constituting said compensation cavities.

20. The process according to claim 19 wherein a third of layer treatment comprises the steps of:
   forming, in said third insulating material present on said substrate, other trenches corresponding to other components in said second portion of the circuit;
   filling substantially said other trenches with a third conducting material;
   polishing said third conducting material to expose said third insulating material in said second portion such that the surface of said third insulating material is higher in said first portion than in said second portion; and
   etching other cavities in said third insulating material in said first portion of said circuit in such a way that said first cavities have their bottoms deeper than the level of said surface of said third insulating material in said second portion of said circuit.

21. The process according to claim 17, wherein partial removal of said second conducting material comprises one of polishing, chemical etching, and dry plasma etching.

22. The process according to claim 17, wherein said first insulating material cavities are shallower than said first insulating material trenches.

23. The process according to claim 17, wherein said removal of said first conducting material in said first portion comprises at least on of the step of etching by means of one of a liquid solution and dry plasma etching.

24. The process according to claim 23, wherein the removal of said first conducting material in the first portion comprises a polishing step.

25. The process according to claim 17, wherein, during said second layer treatment compensation cavities are formed in said second insulating material, which are substantially filled with the second conducting material, and wherein said second layer treatment furthermore includes, after partial removal of the second conducting material, the step of removing said second conducting material from said compensation cavities that are formed in said second insulating material.

26. The process according to claim 25, wherein said removal of said second conducting material from said compensation cavities formed in said second insulating material comprises either one of the steps of masking said trench corresponding to said first component, and chemical etching by means of a liquid solution or dry plasma etching.

27. The process according to claim 25, wherein said compensation cavities are formed simultaneously with said trench corresponding to said first component.

28. The process according to claim 25, further comprising the step of forming, during said second layer treatment, trenches corresponding to at least some of said second components in said second insulating material in said second portion, wherein said partial removal of said second conducting material is carried out so as to furthermore expose part of said second insulating material in said second portion.

29. The process according to claim 28 wherein the removal of the second conducting material from the compensation cavities in said second insulating material includes the step of masking ones of said trenches corresponding to said first and second components.

30. The process according to claim 17, wherein said first component is one of an inductor, an antenna, a high-speed electrical signal transmission line, and a capacitor.

31. The process according to claim 17, wherein at least one of said first and second electrically insulating materials deposited as respective layers are polished before the formation of said compensation cavities and said trenches in each of at least one of said first and second insulating materials.

32. The process according to claim 17, wherein at least one of said first and second electrically insulating materials are deposited in respective layers each having a plane upper surface.

* * * * *

UNITED STATES PATENT AND TRADEMARK OFFICE
CERTIFICATE OF CORRECTION

PATENT NO. : 7,064,053 B2
APPLICATION NO. : 10/651492
DATED : June 20, 2006
INVENTOR(S) : Srdjan Kordic et al.

It is certified that error appears in the above-identified patent and that said Letters Patent is hereby corrected as shown below:

Column 16, claim 23, please delete claim 23 in it's entirety and replace with the following: --The process according to claim 17, wherein said removal of said first conducting material in said first portion comprises at least one of etching by means of a liquid solution and dry plasma etching.--

Signed and Sealed this

Thirteenth Day of February, 2007

JON W. DUDAS
*Director of the United States Patent and Trademark Office*